United States Patent [19]
Suzuki et al.

[11] Patent Number: 5,396,067
[45] Date of Patent: Mar. 7, 1995

[54] SCAN TYPE ELECTRON MICROSCOPE

[75] Inventors: Shohei Suzuki, Tokyo; Shintaro Kawata; Keitaro Hara, both of Kawasaki, all of Japan

[73] Assignee: Nikon Corporation, Tokyo, Japan

[21] Appl. No.: 71,268

[22] Filed: Jun. 4, 1993

[30] Foreign Application Priority Data

Jun. 11, 1992 [JP] Japan .................................. 4-177577
Nov. 30, 1992 [JP] Japan .................................. 4-319981
Feb. 10, 1993 [JP] Japan .................................. 5-021571

[51] Int. Cl.$^6$ ........................................... H01J 37/252
[52] U.S. Cl. .................................... 250/310; 250/306; 250/397
[58] Field of Search ................ 250/310, 306, 307, 397

[56] References Cited

U.S. PATENT DOCUMENTS 4,720,633  1/1988  Nelson .................................. 250/310
4,785,182  11/1988  Mancuso et al. .................... 250/310

FOREIGN PATENT DOCUMENTS

04-129147  4/1992  Japan .

*Primary Examiner*—Jack I. Berman
*Assistant Examiner*—James Beyer
*Attorney, Agent, or Firm*—Shapiro and Shapiro

[57] ABSTRACT

A scan type electron microscope has an electron beam generating source for generating an electron beam with which a sample is irradiated; a sample chamber, supplied with a gas for effecting a gas amplification, for housing the sample; a secondary electron detecting means, installed in the sample chamber, for detecting secondary electrons gas-amplified by the gas after being generated from the sample with the irradiation of the electron beam; and an electrode, disposed between the sample and the secondary electron detecting means, for absorbing positive ions produced when the secondary electrons are gasamplified by the gas. The electrode may be constituted by a further fine tube extended from a pressure limiting aperture to a position just above the sample and formed with a path of the electron beam. The absorption of the positive ions prevents a positive charge-up of the sample, whereby a voltage between the sample and the secondary electron detecting means can be kept at a fixed level. A scatter of the primary electron beam can also be remarkably reduced so as to eliminate scattered electrons which cause noise.

14 Claims, 5 Drawing Sheets

SCAN TYPE ELECTRON MICROSCOPE

BACKGROUND OF THE INVENTION

1. Field of the Invention

The present invention relates to an environment-control-oriented scan type electron microscope.

2. Related Background Art

In a typical scan type electron microscope, secondary electrons emitted from a sample (target) disposed in a vacuum are detected by luminescence of a scintillator. In contrast with this, according to an environment-control-oriented scan type electron microscope, the secondary electrons from the sample disposed in a low-pressure gas such as a water vapor are gas-amplified by the gas. The thus amplified secondary electrons are detected directly by a detection electrode. This environment-control-oriented scan type electron microscope is capable of viewing a variety of samples that could not be viewed by ordinary electron microscopes.

In an ordinary low-acceleration scan type electron microscope, however, a primary electron beam incident on the sample is substantially equivalent to a quantity of the secondary electrons emitted from the sample. Contrastingly, in the environment-control-oriented scan type electron microscope, an acceleration voltage of the electron beam is relatively large. Hence, the quantity of the secondary electrons emitted from the sample is smaller than a quantity of the primary electron beam incident on the sample. For this reason, a negative charge-up (electrification) of the sample is easy to take place in the environment-control-oriented scan type electron microscope. A mechanism for neutralizing the negative charge of the sample is therefore required.

Figure 9:
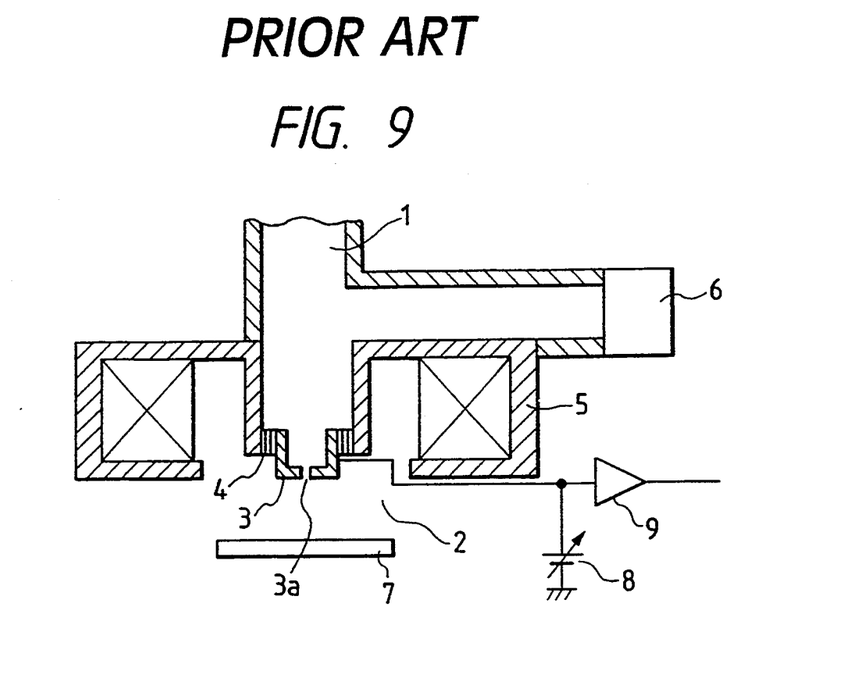
FIG. 9 is a vertical sectional view schematically illustrating a construction of the principal portion of an environment-control-oriented scan type electron microscope in one example of the prior art.

FIG. 9 shows one example of the conventional environment-control-oriented scan type electron microscope. Referring to FIG. 9, an electron gun (unillustrated) is installed in a vacuum chamber 1 (consisting of, as a matter of fact, a plurality of subchambers partitioned by an aperture for differential exhausting). The vacuum chamber 1 is adjacent to a sample chamber 2 (its outer frame is not shown) for housing a sample 7 through a pressure limiting aperture plate 3. An objective lens composed of an electromagnetic lens is provided along the circumference of the pressure limiting aperture plate 3 through an insulator 4. The sample chamber 2 is supplied with a gas (e.g., a water vapor) for effecting a gas amplification from an unillustrated supply source. At the same time, a gas pressure in the sample chamber 2 is kept on the order of 0.1 Torr to several tens of Torr by means of an unillustrated vacuum pump. Further, the gas in the sample chamber 2 flows via the pressure limiting aperture plate 3 into the vacuum chamber 1. However, a gas pressure in the vacuum chamber 1 is kept under a smaller pressure (state of a higher degree of vacuum) on the order of $10^{-2}$ to $10^{-3}$ Torr just above, e.g., the pressure limiting aperture plate 3 than in the interior of the sample chamber 2 by means of a vacuum pump 6. In fact, as explained above, the vacuum chamber 1 is partitioned by the aperture into the plurality of subchambers. The vacuum pump is provided in each subchambers. The electron gun is installed in the subchamber exhibiting the highest degree of vacuum.

A sample 7 defined as a view target is housed in the interior of the sample chamber 2. Further, in this conventional example, the pressure limiting aperture plate 3 serves as a secondary electron detector. A positive voltage with respect to the sample 7 is applied to the pressure limiting aperture plate 3 from a variable voltage source 8. A secondary electron signal obtained from the pressure limiting aperture plate 3 is led via a preamplifier 9 to an unillustrated processor.

When viewing the sample 7, the sample 7 is irradiated with a primary electron beam emitted from the electron gun in the vacuum chamber 1 via an aperture 3a of the pressure limiting aperture plate 3. At this time, the secondary electrons emitted from the sample 7 are gas-amplified by the gas existing in the sample chamber 2 while migrating toward the pressure limiting aperture plate 3 because of an electric field of the pressure limiting aperture plate 3 serving as the secondary electron detector. Positive ions produced as a result of this fall on the sample 7, thereby neutralizing a negative charge of the sample 7 which is generated with the irradiation of the electron beam. Further, the gas-amplified secondary electrons are taken in the pressure limiting aperture plate 3 serving as the secondary electron detector. A secondary electron signal thereof is taken in an external processor via a preamplifier 9.

Figure 10:
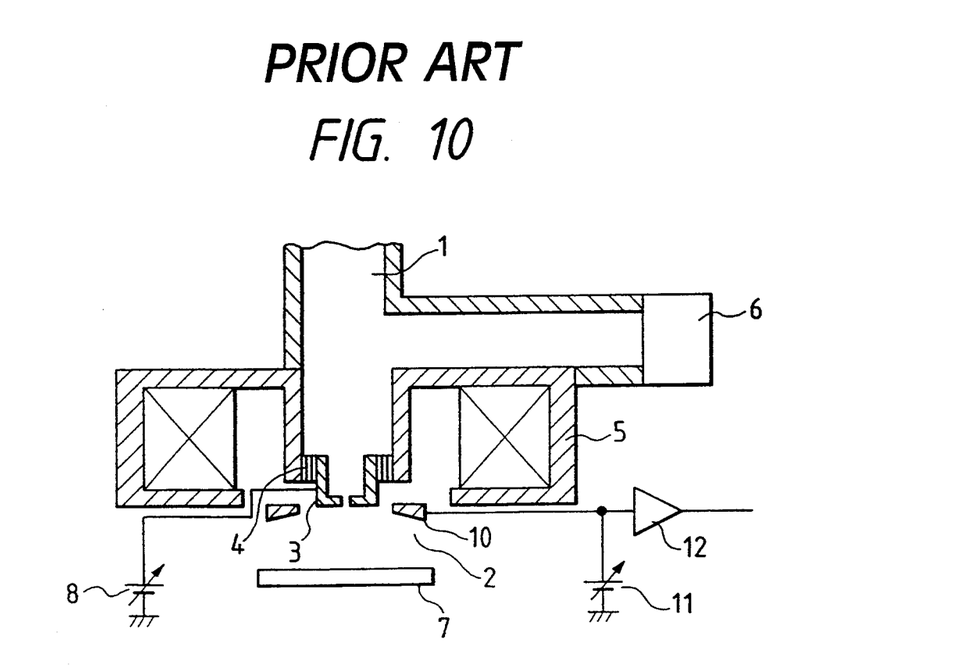
FIG. 10 is a vertical sectional view schematically illustrating a construction of the principal portion of the environment-control-oriented scan type electron microscope in another example of the prior art.

FIG. 10 illustrates another example of the conventional environment-control-oriented scan type electron microscope. In this conventional example, the pressure limiting aperture plate and the secondary electron detector are separately provided. Referring to FIG. 10, the portions corresponding to those in FIG. 9 are marked with the like symbols, and the detailed explanations thereof will be omitted.

Referring again to FIG. 10, a ring-like secondary electron detector 10 having a minor diameter of several mm is disposed along the circumference of the pressure limiting aperture plate 3 upwardly of the sample 7. A positive voltage is applied to the secondary electron detector 10 from a variable voltage source 11. The secondary electron signal from the secondary electron detector 10 is also taken in the unillustrated processor via a preamplifier 12. Further, the positive voltage with respect to the sample 7 is also applied to the pressure limiting aperture plate 3 from the variable voltage source 8.

In the apparatuses shown in FIGS. 9 and 10, however, a much larger amount of excessive positive ions than an amount of incidence of the primary electron beam fall on the sample 7. This results in a positive charge-up of the sample 7. As a consequence of this charge-up, a potential difference between the secondary electron detector and the sample is decreased; and a gas amplification rate of the secondary electrons is reduced. For this reason, there exist inconveniences in which a gain of the secondary electron detector declines, and an SN ratio of a view image obtained decreases.

A reduction in the potential difference between the secondary electron detector and the sample due to the charge-up of the sample 7 may be compensated by stepping up a voltage of the secondary electron detector. However, in such case, a potential difference between the secondary electron detector and a metal (e.g., lens) at an earth potential in the vicinity of this detector in turn becomes too large. A trace amount of discharge is caused therebetween. This results in noise on the view image, so that is becomes impossible to improve the SN ratio.

SUMMARY OF THE INVENTION

It is a primary object of the present invention, which has been devised in view of the points described above, to provide a scan type electron microscope capable of obtaining a view image exhibiting a high SN ratio.

To accomplish the object, according to one aspect of the invention, there is provided a scan type electron microscope comprising: an electron beam generating source for generating an electron beam with which a sample is irradiated; a sample chamber, supplied with a gas for effecting a gas amplification, for housing the sample; a secondary electron detecting means, installed in the sample chamber, for detecting secondary electrons gas-amplified by the gas after being generated from the sample with the irradiation of the electron beam; and an electrode, disposed between the sample and the secondary electron detecting means, for absorbing positive ions produced when gas-amplified by the gas.

Based on the construction given above, some of the positive ions produced by the gas-amplification within the sample chamber contribute to neutralization of a negative charge-up of the sample due to the irradiation of the electron beam. The great majority of positive ions are, however, absorbed by the electrode serving as an ion collector disposed between the sample and the secondary electron detector. The thus conducted absorption of the positive ions prevents the positive charge-up of the sample. A voltage between the sample and the secondary electrode detector can be kept at a fixed level. Hence, a secondary electrode detection signal having a high SN ratio is obtained. A view image with less noise can be obtained.

Further, to accomplish the object given above, according to another aspect of the invention, there is provided a scan type electron microscope comprising: an electron beam generating source for generating an electron beam with which a sample is irradiated; a vacuum chamber formed with a path of the electron beam generated from the electron beam generating source; a sample chamber, communicated with the vacuum chamber via a pressure limiting aperture admitting a passage of the electron beam and supplied with a gas for effecting a gas amplification, for housing the sample; a secondary electron detecting means, installed in the sample chamber, for detecting secondary electrons gas-amplified by the gas after being generated from the sample with the irradiation of the electron beam; and a fine tube extended from the pressure limiting aperture in an interior of the sample chamber to a position just above the sample and formed with a path of the electron beam.

Based on the construction described above, the fine tube is formed with the primary electron beam path which is evacuated and extended from the pressure limiting aperture to a position just above the sample. The primary electron beam travels a short span through the gas from an exit of the fine tube to the sample. A due-to-gas scatter of the primary electron beam is therefore remarkably reduced. Accordingly, the diameter of the primary beam does not increase. The scattered electrons which will cause the noise also disappear.

Further, if this fine tube serves as an earth electrode, because of the fine tube extending to a position just above the sample, extra positive ions which do not contribute to neutralization of the negative charge-up among the positive ions produced by the gas-amplification are drawn to and eventually absorbed by this electrode. Hence, no positive charge-up of the sample is induced.

As a result, it is possible to obtain the view image exhibiting the high resolving power and high SN ratio.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Figure 1:
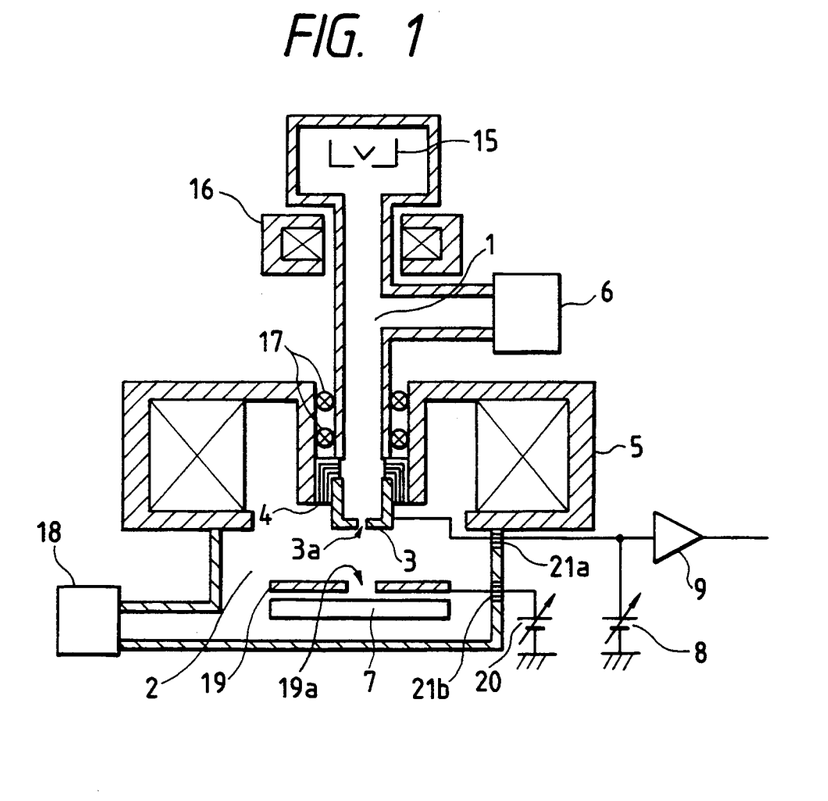
FIG. 1 is a vertical sectional view schematically illustrating a construction of a scan type electron microscope in a first embodiment of the present invention.

A first embodiment of a scan type electron microscope according to the present invention will hereinafter be described with reference to FIG. 1. In accordance with this embodiment, the present invention is applied to an environment-control-oriented scan type electron microscope. Referring to FIG. 1, the portions corresponding to those in FIG. 9 are marked with the like symbols, and detailed explanations thereof will be omitted.

Referring to FIG. 1, an electron gun 15 is installed in an upper part of a vacuum chamber 1. A condenser lens 16 is disposed outwardly of a mid-stage of the vacuum chamber 1. Electromagnetic deflectors 17 are disposed outwardly of a lower-stage of the vacuum chamber 1. Note that the vacuum chamber 1 is illustrated as a single chamber for simplifying the explanation but is, as a matter of fact, partitioned by a plurality of pressure limiting aperture plates into, e.g., three subchambers.

Each subchamber is differentially exhausted by a vacuum pump. Then, the electron gun 15 is installed in the subchamber exhibiting the highest degree of vacuum. The vacuum chamber 1 and a sample chamber 2 for housing a sample 7 are placed with the pressure limiting aperture plate 3 being interposed therebetween. An unillustrated supply source supplies this sample chamber with a gas (e.g., water vapor) for effecting a gas amplification. At the same time, a gas pressure in the sample chamber 2 is kept on the order of 0.1 Torr to several tens of Torr.

The gas in the sample chamber 2 leaks, after passing through an aperture 3a of the pressure limiting aperture plate 3, into the vacuum chamber 1. A gas pressure in the vacuum chamber 1 is, however, maintained in a higher degree of vacuum (under a smaller pressure) than in the sample chamber 2 by means of a vacuum pump 6 (actually, the degree of vacuum gradually increases due to the differential exhausting).

In accordance with this embodiment, the pressure limiting aperture plate 3 serves as a secondary electron detector. The pressure limiting aperture plate 3 is supplied with a positive voltage with respect to the sample 7 from a variable voltage source 8 via an insulting hermetic seal 21a provided on a side wall of the sample chamber 2. A secondary electron signal from the pressure limiting aperture plate 3 is led via a preamplifier 9 to an unillustrated processor.

In this embodiment, an ion collector 19 consists of an electrode plate formed with a circular hole 19a in its central part. The ion collector 19 is located in an interior of the sample chamber between the pressure limiting aperture plate 3 and the sample 7. Further, the ion collector 19 is supplied with a positive voltage with respect to the sample 7 from a variable voltage source 20 via an insulating hermetic seal 21b provided on the side wall of the sample chamber 2. The voltage supplied to the ion collector 19 from the variable voltage source 20 is set on the order of 0 V to +500 V so that the secondary electrons generated from the sample 7 easily pass through the hole 19a of the ion collector 19.

Note that a negative voltage may be applied to the ion collector 19 as the necessity arises in some cases.

Next, the operation of this embodiment will be explained.

An electron beam emitted from the electron gun 15 is converged by the condenser lens 16. Thereafter, the sample 7 stored in the interior of the sample chamber 2 is irradiated with the electron beam which has passed through the hole 19a of the ion collector 19 as well as through the aperture 3a of the pressure limiting aperture plate 3. The sample is also scanned by the electron beam with the aid of the electromagnetic deflectors 17. At the same time, a spot diameter of the electron beam on the sample 7 is set to a predetermined value through an object lens 5. Then, the sample 7 is irradiated with the first electron beam, whereby the secondary electrons are generated from the sample 7.

The secondary electrons generated from the sample 7 pass through the hole 19a of the ion collector 19. The secondary electrons are thereafter drawn toward the pressure limiting aperture plate 3 by dint of an electric field formed by the pressure limiting aperture plate 3 serving as a secondary electron detector. In the course of this, the secondary electrons are repeatedly bombarded with gaseous components existing in the interior of the sample chamber, thereby generating a large amount of positive ions.

The positive ions have hitherto fallen directly on the sample 7. In accordance with this embodiment, however, the ion collector 19 exists between the pressure limiting aperture plate 3 and the sample 7. With this configuration, some ions fall on the sample 7 after passing through the hole 19a of the ion collector 19. A great majority of ions are, however, absorbed by the ion collector 19. For this reason, the sample 7 can be prevented from a positive charge-up.

As a result, a voltage between the sample 7 and the pressure limiting aperture plate 3 serving as the secondary electron detector is kept substantially at a fixed level. A secondary electron signal exhibiting a high SN ratio is obtained from the pressure limiting aperture plate 3. Namely, a well-formed view image having the high SN ratio is finally obtained.

Figure 2:
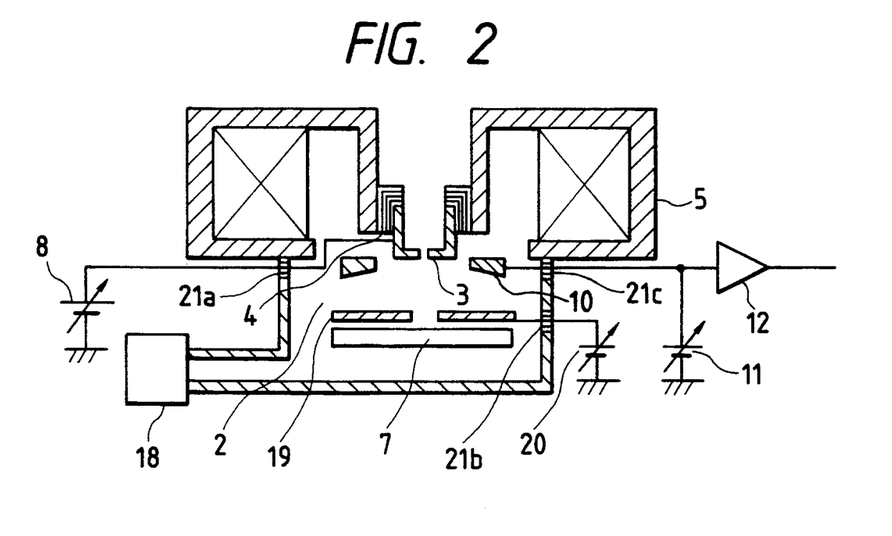
FIG. 2 is a vertical sectional view schematically illustrating a construction of the principal portion of the scan type electron microscope in a second embodiment of this invention.

The following is an explanation of a second embodiment of the scan type electron microscope of this invention with reference to FIG. 2. Incidentally, the portions corresponding to those in FIGS. 1 and 10 are marked with the like symbols, and detailed explanations thereof will be omitted. Turning to FIG. 2, the vacuum chambers, the vacuum pump 6, the electron gun 15, the condenser lens 16 and the electromagnetic deflectors 17 are also the same as those shown in FIG. 1 and therefore omitted.

In the first embodiment discussed above, the pressure limiting aperture plate 3 serves as the secondary electron detector. In accordance with this embodiment, however, as illustrated in FIG. 2, a secondary electron detector is provided separately from the pressure limiting aperture plate 3.

Referring to FIG. 2, a ring-like secondary electron detector 10 is disposed along the circumference of the pressure limiting aperture plate 3 upwardly of the ion collector 19. The secondary electron detector 10 is supplied with a positive voltage with respect to the sample 7 from a variable voltage source 11 via a hermetic seal 21c provided on the side wall of the sample chamber 2. Then, a secondary electron signal from the secondary electron detector 10 is outputted via a preamplifier 12 to an unillustrated processor. Further, the pressure limiting aperture plate 3 is supplied with a positive voltage from a variable voltage source 8. Configurations of other portions are the same as those shown in FIG. 1.

In the scan type electron microscope shown in FIG. 2, the electron beam emitted from the electron gun is incident on the sample 7 after traveling through the hole 19a of the ion collector 19 as well as through the aperture of the pressure limiting aperture plate 3. The secondary electrons generated from the sample 7 when irradiated with the electron beam pass through the hole 19a of the ion collector 19. The secondary electrons are then captured by the secondary electron detector 10 while being gas-amplified. In this embodiment also, the positive ions are absorbed by the ion collector 19. A charge-up of the sample 7 to the positive potential is thereby prevented. Obtained consequently is a secondary electron signal which is always kept uniform and exhibits a high SN ratio.

In accordance with the second embodiment discussed above, a traveling distance of the secondary electrons when gas-amplified increases. Therefore, the same gas amplification rate of the secondary electrons as that in the first embodiment is obtained with a higher degree of vacuum (smaller pressure).

Next, a third embodiment of the scan type electron microscope of the present invention will be described with reference to FIG. 3. In the third embodiment, a diameter of the hole 19a of the ion collector 19 employed in the first embodiment is made variable.

Figure 3:
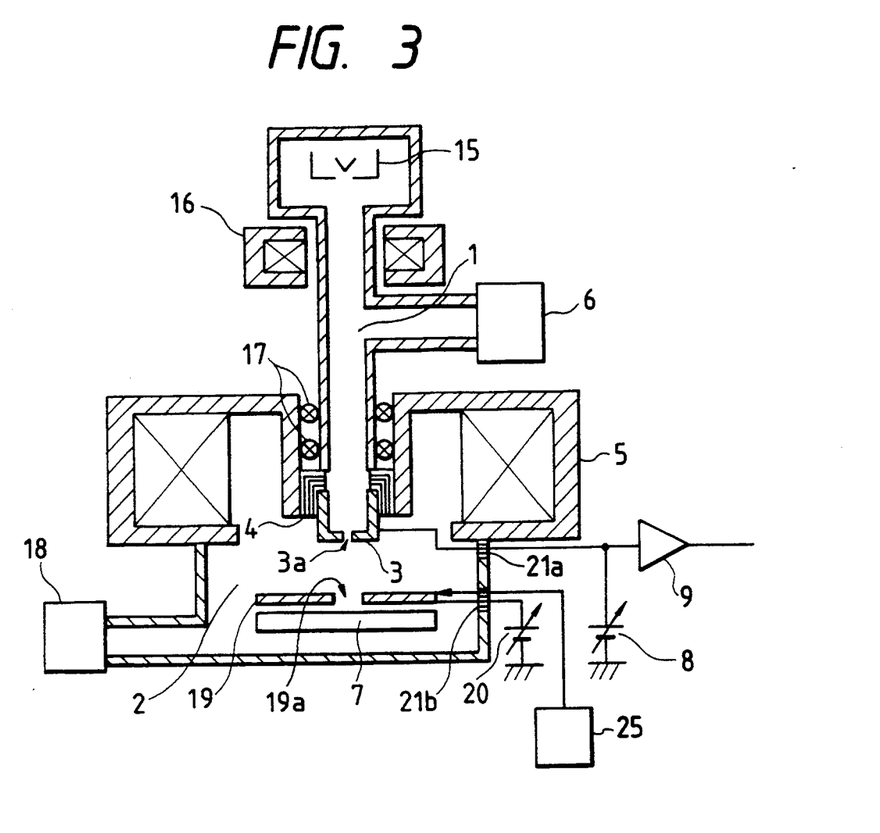
FIG. 3 is a vertical sectional view schematically illustrating a construction of the scan type electron microscope in a third embodiment of this invention.

FIG. 3 illustrates the scan type electron microscope in this embodiment. Note that the portions corresponding to those in FIG. 1 are marked with the like symbols, and detailed explanations thereof will be omitted.

Referring to FIG. 3, the ion collector 19 is connected to an ion collector hole diameter indicating device 25 located outside the sample chamber 7 via the hermetic seal 21b provided on the side wall of the sample chamber 2. The diameter of the central hole 19a of the ion collector 19 is set to a value indicated by the ion collector hole diameter indicating device 25 (as a matter of fact, the operator sets the diameter of the hole 19a of the ion collector 19 by transmitting a control signal to the ion collector hole diameter indicating device 25 from an unillustrated input unit while seeing the view image). In order to vary the diameter of the hole 19a, the ion collector 19 may be constructed, for example, with a rotary disk formed with a plurality of openings having different diameters and having a rotational center shaft eccentric by a predetermined quantity from the electron beam axis. Alternatively, a slider having a plurality of openings with different diameters could be used. The rotary disk is then rotated or the slider rectilinearly moved in conformity with. collector hole diameter indicating device 25. The hole having a desired diameter may be thus aligned with the beam axis.

In addition, there may be are provided an aperture stop device for opening and closing aperture blades with rotations of an aperture ring employed for a camera or the like. Provided also may be a converting device for converting rectilinear motions into rotations of the aperture ring. A member disposed outwardly of the sample chamber 2 and making rectilinear motions may be connected via the hermetic seal 21b to the aperture ringing the interior of the sample chamber 2. In this case, the member making the rectilinear motions serves as an ion collector hole diameter indicating device 25. The hole diameter of the ion collector 19 can be varied with the mechanical motions of this ion collector hole diameter indicating device 25. Further, the rotations of the aperture ring may be electrically controlled by use of a motor.

In accordance with this embodiment, the diameter of the hole 19a of the ion collector 19 is adjusted so that the positive ions just enough to neutralize the negative charge-up of the sample 7 fall on the sample 7. The positive charge-up of the sample 8 can be thereby prevented more completely, thereby obtaining a view image having a higher SN ratio.

Figure 4:
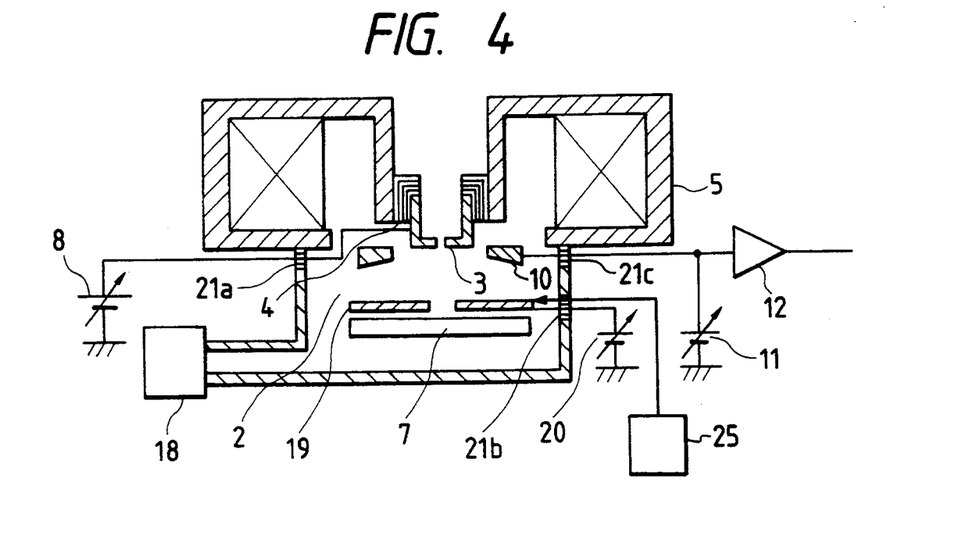
FIG. 4 is a vertical sectional view schematically illustrating a construction of the principal portion of the scan type electron microscope in a fourth embodiment of this invention.

FIG. 4 illustrates a fourth embodiment of the present invention. This embodiment has the same basic construction as the second embodiment previously described, but includes an arrangement as above discussed to make variable the diameter of the hole of the ion collector 19. In this embodiment also, the positive charge-up of the sample 7 can be prevented as done in the third embodiment discussed above.

Next, a fifth embodiment of the present invention will be described with reference to FIG. 5. This embodiment is a further developed form of the second embodiment given above. Note that the portions corresponding to those shown in FIGS. 1 and 2 are marked with the like symbols, and the detailed explanations thereof will be omitted.

An ion collector 22 is formed with a hole 22a aligned with the axis of the electron beam. The ion collector 22 is provided between the pressure limiting aperture plate 3 and the sample 7. The ion collector 22 works to partition the sample chamber into a first subchamber 2a on the side of the pressure limiting aperture plate 3 from the ion collector 22 and a second subchamber 2b on the side of the sample 7 from the ion collector 22. The first and second subchambers 2a, 2b are independently exhausted by vacuum pumps 23 and 18, respectively. Then, a pressure in the first subchamber 2a is set smaller than a pressure in the sample chamber 2 employed in the second embodiment. A pressure in the second subchamber 2b is set larger than the pressure in the sample chamber 2 used in the second embodiment. Namely, the pressure in the first subchamber 2a is set smaller (approximate to 0) than the pressure in the second subchamber 2b.

The ion collector 22 is supplied with a voltage on the order of 0 V to +500 V similarly as in the second embodiment discussed above. Further, the secondary electron detector 10 is supplied with a positive voltage with respect to the sample 7 from a variable voltage source 11 via an insulating hermetic seal 24c provided on a side wall of the first subchamber 2a. Then, a secondary electron signal from the secondary electron detector 10 is led via a preamplifier 12 to an unillustrated processor.

Further, the pressure limiting aperture plate 3 is supplied with a positive voltage from the variable voltage source 8 through an insulating hermetic seal 24b of the second subchamber 2b as well as through an insulating hermetic seal 24a on the side wall of the first subchamber 2a. Other configurations are the same as those in FIG. 2.

Figure 5:
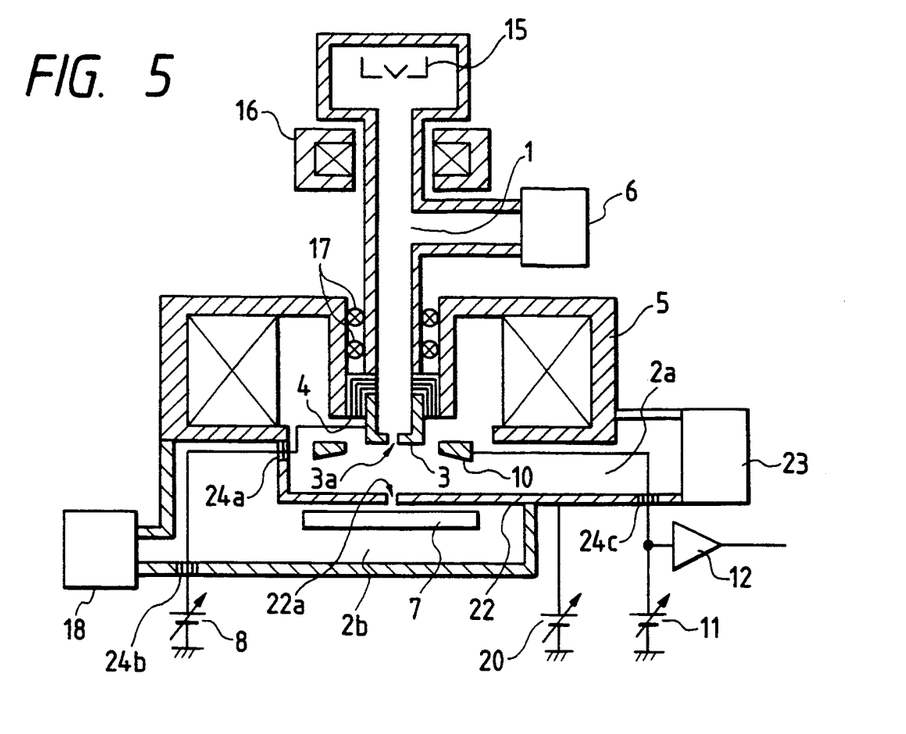
FIG. 5 is a vertical sectional view schematically illustrating a construction of the scan type electron microscope in a fifth embodiment of this invention.

In this scan type electron microscope in FIG. 5 also, the electron beam emitted from the electron gun 15 is incident on the sample 7 after traveling through the aperture 3a of the pressure limiting aperture plate 3 and the hole 22a of the ion collector 22. Then, the secondary electrons generated from the sample 7 with the incidence of the electron beam pass through the hole 22a of the ion collector 22. The secondary electrons are then captured by the secondary electron detector 10 while being gas-amplified. In this case, a scattering quantity of the primary electron beam incident on the sample 7 increases corresponding to a product of a gas pressure and a distance. In this embodiment, however, the pressure in the first subchamber 2a is set small, and, therefore, the product of the gas pressure and the distance is smaller than in the second embodiment. As a result, the scatter of the primary electron beam in this embodiment is less than in the second embodiment. Accordingly, a secondary electron detection signal exhibiting a higher SN ratio than in the second embodiment is obtained in accordance with this embodiment.

Moreover, in this embodiment, a voltage on the order of 0 V to +500 V is applied to the ion collector 22 as in the second embodiment described above. A pressure between the sample 7 and the ion collector 22 is, however, higher than in the second embodiment. Hence, a considerable amount of gas amplification takes place also in an area between the sample 7 and the ion collector 22. The positive ions produced as a result of this gas amplification are not, unlike the second embodiment, absorbed by the ion collector but all fall on the sample 7 having a low electric potential. The negative charge on the sample 7 is thereby neutralized almost completely. In this instance, the gas pressure in the second subchamber 2b between the ion collector 22 and the sample 7 is controlled to such an extent as to generate the least amount of ions enough to neutralize the negative charge on the sample 7.

As explained earlier, according to the fifth embodiment, the scatter of the primary electron beam incident on the sample 7 is restrained. At the same time, the negative charge on the sample 7 is substantially completely neutralized by the ions produced with the gas amplification. The view image exhibiting a much higher SN ratio can be thereby obtained.

Next, a sixth embodiment of the present invention will be described with reference to FIG. 6.

Figure 6:
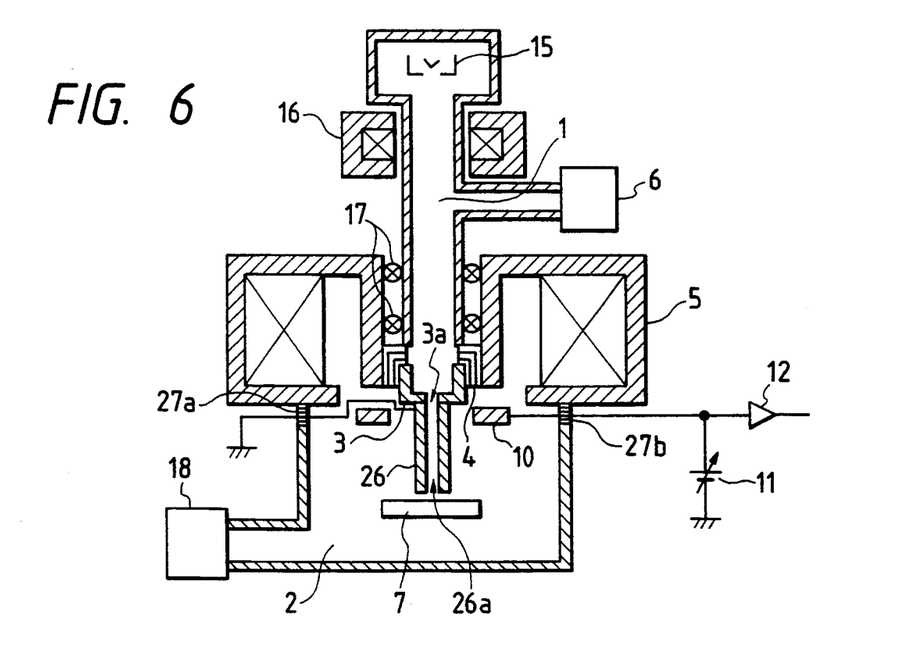
FIG. 6 is a vertical sectional view schematically illustrating a construction of the scan type electron microscope in a sixth embodiment of this invention.

FIG. 6 schematically illustrates a construction of the scan type electron microscope in this embodiment. Incidentally, the portions corresponding to those shown in FIGS. 1 and 10 are marked with the like symbols, and the detailed explanations thereof will be omitted.

The electron gun 15 is installed in the upper part of the vacuum chamber 1. The condenser lens 16 is disposed outwardly of the mid-stage of the vacuum chamber 1. The electromagnetic deflectors 17 are disposed outwardly of the lower-stage of the vacuum chamber 1. Further, the vacuum chamber 1 and the sample chamber 2 for housing the sample 7 are placed with the pressure limiting aperture plate 3 being interposed therebetween. An unillustrated supply source supplies this sample chamber with a gas for effecting the gas amplification. At the same time, the gas pressure in the sample chamber 2 is controlled by a vacuum pump 18.

Figure 7:
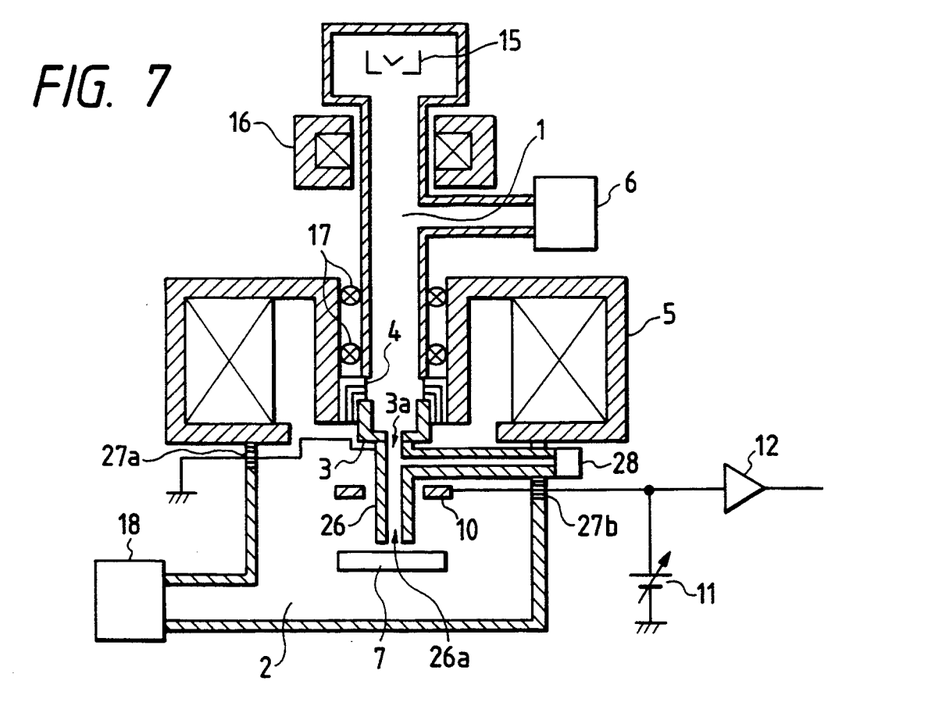
FIG. 7 is a vertical sectional view schematically illustrating a construction of a modified example of the fifth embodiment of the scan type electron microscope according to this invention.

A metallic fine tube 26 formed with a path of the electron beam emitted from the electron gun 15 is extended from the pressure limiting aperture plate 3 down to a position just above the sample 7. A tip of the fine tube 26 is located between the sample 7 and the secondary electron detector 10. Further, the fine tube 26 has a minor diameter which is substantially the same as the pressure limiting aperture 3a of the pressure limiting aperture plate 3. Moreover, a line connected to the earth through an insulating hermetic seal 27a on the side wall of the sample chamber 2 is connected to the fine tube 26. The fine tube 26 is thus earthed. The gas in the sample chamber 2 leaks into the vacuum chamber 1 via the aperture 3a of the pressure limiting aperture plate 3 from an electron beam path 26a of the fine tube 26. The gas pressure in the vacuum chamber 1 is, however, kept in a higher degree of vacuum (under a smaller pressure) than in the sample chamber 2 by the vacuum pump 6. Incidentally, only the vacuum pump 6 is illustrated in the Figure. However, a plurality of vacuum pumps may be employed. For instance, if allowed in terms of space, as in a modified example shown in FIG. 7, a vacuum pump 28 dedicated to exhaust directly an interior of the fine tube 26 may be provided.

The secondary electron detector 10 is supplied with a positive voltage with respect to the sample 7 from the variable voltage source 11 via an insulating hermetic seal 27b on the side wall of the sample chamber 2. A secondary electron signal from this secondary electron detector 10 is led via a preamplifier 12 to an unillustrated processor.

An explanation of the operation of this embodiment will be given. The electron beam emitted from the electron gun 15 is converged by the condenser lens 16. Thereafter, the sample 7 in the interior of the sample chamber 2 is irradiated with the electron beam via the pressure limiting aperture 3a of the pressure limiting aperture plate 3 and the interior of the fine tube 26.

In the case of the prior art, the primary electron beam passing through the pressure limiting aperture 3a travels a distance (approximately several mm) through the gas up to the sample 7. Consequently, the primary electron beam is scattered by the gas, resulting in a larger spot diameter than that of the original electron beam. This contributes to a decline of resolving power or a decrease in the SN ratio due to noises caused by the scattered electrons in some cases.

In accordance with the present embodiment of the invention, however, the electron beam path 26a exhausted directly by the vacuum pump 18 is provided on the route of the primary electron beam within the sample chamber 2. The traveling distance of the primary electron beam through the gas becomes very short, and hence the scatter of the primary electron beam can be remarkably reduced.

The sample 7 is scanned by the primary electron beam with the aid of the electromagnetic deflectors 17. At the same time, the primary electron beam is converged on the sample 7 by means of the objective lens 5. The secondary electrons are generated with the irradiation of this primary electron beam. The secondary electrons generated from the sample 7 are drawn toward the secondary electron detector 10 because of an electric field produced by the secondary electron detector 10. In the course of this action, the secondary electrons are repeatedly bombarded with the internal Gas of the sample chamber 2. A large amount of positive ions are thereby produced. In the case of the prior art, these positive ions fall on the sample 7. Some ions contribute to neutralization of the negative charge-up of the sample 7, and yet the excessive positive ions as a remainder remains on the sample 7. A positive charge-up of the sample 7 is thereby induced. In the present embodiment of the invention, however, the fine tube 26 formed with the path of the primary electron beam is disposed as an earth electrode just above the sample. The extra positive ions which do not contribute to the neutralization of the negative charge-up of the sample 7 are therefore drawn toward the fine tube 26 serving as the earth electrode and adsorbed in the course of time. Accordingly, there is no possibility to cause the positive charge-up of the sample.

As a consequence of this, the primary electron beam is almost not scattered but reaches the sample 7 while the beam diameter remains small. Further, because positive charge-up of the sample 7 is avoided, a potential difference between the sample 7 and the secondary electron detector 10 is kept at a substantially fixed level. The secondary electron signal having a high SN ratio is obtained from the secondary electron detector 10. As a result, a well-formed view image exhibiting the high resolving power and high SN ratio is acquired.

In accordance with this embodiment, the earthed fine tube 26 is located just above the sample, and, therefore, some of the secondary electrons generated from the sample are absorbed by the fine tube and do not reach the secondary electron detector. For this reason, a capture efficiency of the secondary electrons by the secondary electron detector is reduced to some extent. Nevertheless, there are greater effects in terms of improving the resolving power and the SN ratio as well owing to the prevention of the scatter of the primary electron beam and of the positive charge-up of the sample.

This embodiment is constructed so that the fine tube is earthed. However, a voltage may be applied as the necessity arises.

Figure 8:
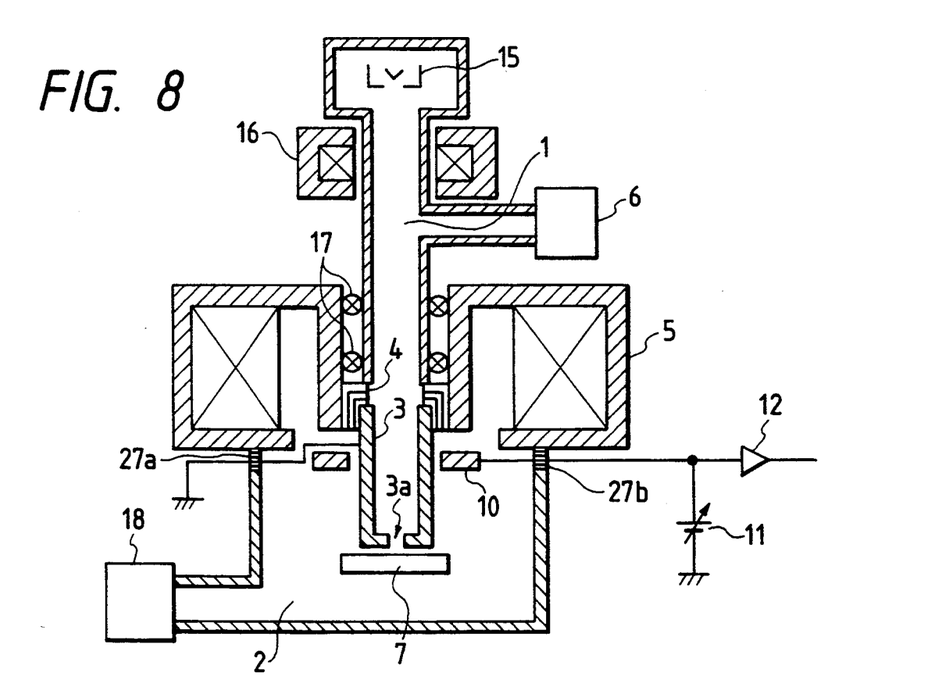
FIG. 8 is a vertical sectional view schematically illustrating a construction of another modified example of the fifth embodiment of the scan type electron microscope according to this invention.

This embodiment is also constructed so that the fine tube 26 is connected to the pressure limiting aperture plate 3 of the vacuum chamber 1. As in a modified example shown in FIG. 8, however, the configuration may be such that the pressure limiting aperture 3a of the pressure limiting aperture plate 3 of the vacuum chamber may be located just above the sample. In this instance, the pressure limiting aperture plate 3 serves as an electrode for absorbing the positive ions generated when the gas amplification takes place.

This invention is not restricted by its embodiments discussed above. A wide range of different working modes can be formed without deviating from the basic principles of the present invention.

What is claimed is:

1. A scan type electron microscope comprising:
   an electron beam generating source for generating an electron beam with which a sample is irradiated;
   a vacuum chamber within which said electron beam passes;
   a sample chamber for housing said sample and in communication with said vacuum chamber via a pressure limiting aperture through which said electron beam passes, said sample chamber being supplied with gas for effecting gas amplification of secondary electrons emitted from said sample with the irradiation of said sample by said electron beam,
   secondary electron detecting means, installed in said sample chamber, for detecting secondary electrons amplified by said gas;
   an electrode, disposed between said sample and said secondary electron detecting means, for absorbing positive ions produced by the gas amplification of secondary electrons; and
   means for maintaining said electrode at a predetermined electrical potential.

2. The scan type electron microscope according to claim 1, wherein said electrode is a circular metal plate having a hole through which said electron beam passes.

3. The scan type electron microscope according to claim 2, wherein a diameter of said hole is variable.

4. The scan type electron microscope according to claim 1, wherein said sample chamber is partitioned by said electrode into a first subchamber located on the side of said secondary electron detecting means from said electrode and a second subchamber located on the side of said sample from said electrode, exhausting means are provided respectively in said first and second subchambers, and a Gas pressure in said first subchamber is set smaller than a Gas pressure in said second subchamber.

5. The scan type electron microscope according to claim 1, wherein said vacuum chamber is of a length substantially equal to a distance from said electron beam generating source to said sample, and said pressure limiting aperture faces said sample.

6. The scan type electron microscope according to claim 1, wherein said electrode includes means for providing holes of different diameters through which said electron beam can be passed selectively.

7. A scan type electron microscope comprising:
   an electron beam generating source for generating an electron beam with which a sample is irradiated;
   a vacuum chamber in which said electron beam passes;
   a sample chamber, for housing said sample, in communication with said vacuum chamber and supplied with gas for effecting gas amplification of secondary electrons emitted from said sample with the irradiation of said sample by said electron beam;
   secondary electron detecting means, installed at a connecting portion between said vacuum chamber and said sample chamber and including a pressure limiting aperture through which said electron beam passes, for detecting secondary electrons amplified by said gas; and
   an electrode, disposed between said sample and said secondary electron detecting means, for absorbing positive ions produced by the gas amplification of secondary electrons.

8. The scan type electron microscope according to claim 7, wherein said electrode is a circular metal plate having a hole through which said electron beam passes.

9. The scan type electron microscope according to claim 8, wherein a diameter of said hole is variable.

10. The scan type electron microscope according to claim 7, wherein said sample chamber is partitioned by said electrode into a first subchamber located on the side of said secondary electron detecting means from said electrode and a second subchamber located on the side of said sample from said electrode, exhausting means are provided respectively in said first and second subchambers, and a Gas pressure in said first subchamber is set smaller than a Gas pressure in said second subchamber.

11. The scan type electron microscope according to claim 6, further comprising means for maintaining said electrode at a predetermined electrical potential.

12. The scan type electron microscope according to claim 7, wherein said electrode includes means for providing holes of different diameters through which said electron beam can be passed selectively.

13. A scan type electron microscope comprising:
   an electron beam generating source for generating an electron beam with which a sample is irradiated;
   a vacuum chamber in which said electron beam passes;
   a sample chamber for housing said sample and in communication with said vacuum chamber via a pressure limiting aperture through which said electron beam passes, said sample chamber being supplied with gas for effecting gas amplification of secondary electrons emitted from said sample with the irradiation of said sample by said electron beam;
   secondary electron detecting means, installed in said sample chamber, for detecting secondary electrons amplified by said gas; and
   a fine tube electrode for absorbing positive ions produced by the gas amplification of secondary electrons and through which said electron beam passes from said pressure limiting aperture to said sample, said fine tube electrode being extended from said pressure limiting aperture substantially to said sample; and
   means for maintaining said fine tube electrode at a predetermined electrical potential.

14. The scan type electron microscope according to claim 13, wherein said fine tube is evacuated by a vacuum pump.

* * * * *